US009825136B2

(12) United States Patent
Niedernostheide et al.

(10) Patent No.: US 9,825,136 B2
(45) Date of Patent: Nov. 21, 2017

(54) SEMICONDUCTOR COMPONENT AND INTEGRATED CIRCUIT

(71) Applicant: Infineon Technologies Austria AG, Villach (AT)

(72) Inventors: Franz Josef Niedernostheide, Hagen a. T.W. (DE); Manfred Pfaffenlehner, Munich (DE); Frank Dieter Pfirsch, Munich (DE); Hans-Joachim Schulze, Taufkirchen (DE); Holger Schulze, Villach (AT); Christoph Weiss, Munich (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 14/643,289

(22) Filed: Mar. 10, 2015

(65) Prior Publication Data
US 2015/0263106 A1  Sep. 17, 2015

(30) Foreign Application Priority Data

Mar. 14, 2014 (DE) .................. 10 2014 103 540

(51) Int. Cl.
*H01L 29/40* (2006.01)
*H01L 29/78* (2006.01)

(52) U.S. Cl.
CPC ........ *H01L 29/402* (2013.01); *H01L 29/7811* (2013.01)

(58) Field of Classification Search
CPC ......... H01L 28/60; H01L 28/82; H01L 28/90; H01L 29/402; H01L 29/7811
See application file for complete search history.

(56) References Cited

U.S. PATENT DOCUMENTS

| 6,602,750 B2 * | 8/2003 | Kao | ................... H01L 29/42324 257/E21.209 |
| 7,394,158 B2 | 7/2008 | Carta et al. | |
| 2005/0003609 A1 * | 1/2005 | Fazan | ................. H01L 21/7687 438/253 |
| 2005/0253168 A1 * | 11/2005 | Wu | ..................... H01L 29/7787 257/192 |
| 2006/0214242 A1 | 9/2006 | Carta et al. | |

(Continued)

FOREIGN PATENT DOCUMENTS

| CN | 101083279 A | 12/2007 |
| DE | 102004030056 A1 | 1/2005 |
| DE | 102011090172 A1 | 8/2012 |

OTHER PUBLICATIONS

Floating-gate MOSFET, Wikipedia, retrived Apr. 27, 2017, p. 1.*

*Primary Examiner* — Allan R Wilson
(74) *Attorney, Agent, or Firm* — Murphy, Bilak & Homiller, PLLC

(57) ABSTRACT

A semiconductor component includes an element composed of a conductive material, which is arranged above a surface of a semiconductor substrate. The element includes an element region not adjoined by any electrical contacts to an overlying or underlying electrically conductive plane. In this case, a surface of the element facing away from the semiconductor substrate is patterned with elevations or depressions and a surface of the element region facing the semiconductor substrate is patterned to a lesser extent or is not patterned.

16 Claims, 8 Drawing Sheets

(56) References Cited

U.S. PATENT DOCUMENTS

| | | | | |
|---|---|---|---|---|
| 2007/0004141 A1* | 1/2007 | Kim | ................. | H01L 21/28114 |
| | | | | 438/257 |
| 2008/0265277 A1* | 10/2008 | Hirler | ................. | H01L 21/765 |
| | | | | 257/139 |
| 2009/0317950 A1 | 12/2009 | Okihara | | |
| 2012/0267637 A1* | 10/2012 | Jeon | ................. | H01L 29/0607 |
| | | | | 257/76 |
| 2013/0049087 A1* | 2/2013 | Ahn | ................. | H01L 23/5223 |
| | | | | 257/296 |
| 2014/0264431 A1* | 9/2014 | Lal | ................. | H01L 27/0883 |
| | | | | 257/121 |

* cited by examiner

SEMICONDUCTOR COMPONENT AND INTEGRATED CIRCUIT

PRIORITY CLAIM

This application claims priority to German Patent Application No. 10 2014 103 540.2 filed on 14 Mar. 2014, the content of said application incorporated herein by reference in its entirety.

TECHNICAL FIELD

The present application relates to a semiconductor component and to an integrated circuit comprising the semiconductor component.

BACKGROUND

Semiconductor components in power electronics serve for example as power switches having a high current-carrying capacity in conjunction with a high blocking capability.

Generally, semiconductor components are sought which have an improved reliability by virtue of the fact that, for example, they maintain their blocking capability over a long operating period and under extreme operating conditions.

Therefore, the object is to specify an improved semiconductor component and a method for producing an improved semiconductor component.

SUMMARY

In accordance with one embodiment, a semiconductor component comprises an element composed of a conductive material, which is arranged above a surface of a semiconductor substrate, having an element region not adjoined by any electrical contacts to an overlying or underlying electrically conductive plane. A surface of the element region facing away from the semiconductor substrate is patterned with elevations or depressions and a surface of the element region facing the semiconductor substrate is patterned to a lesser extent or is not patterned.

In accordance with a further embodiment, a semiconductor component comprises an element composed of a conductive material, which is arranged above a surface of a semiconductor substrate. A layer is arranged below the element and its surface facing the element is patterned such that the surface of the element facing away from the semiconductor substrate has an enlargement of 10% or more compared with a horizontal surface.

A further embodiment specifies a semiconductor component, comprising an active region having a component cell formed in a semiconductor substrate. An edge region is present outside the active region. A field plate is arranged in the edge region above a surface of the semiconductor substrate, wherein the field plate has openings or at least two field plate sections spaced apart from one another.

The person skilled in the art will recognize additional features and advantages after reading the following detailed description and considering the accompanying drawings.

BRIEF DESCRIPTION OF THE DRAWINGS

The accompanying drawings are enclosed in order to afford a further understanding of exemplary embodiments of the invention, and they are included in the disclosure and form a part thereof. The drawings illustrate exemplary embodiments of the present invention and together with the description serve to elucidate the principles. Other exemplary embodiments of the invention and a large number of the intended advantages are immediately acknowledged since they can be better understood with reference to the following detailed description. The elements of the drawings are not necessarily true to scale relative to one another. Identical reference signs indicate correspondingly similar parts.

DETAILED DESCRIPTION

In the following detailed description, reference is made to the accompanying drawings, which form part of the disclosure and for illustration purposes show specific exemplary embodiments in which the invention can be implemented. In this regard, direction terminology such as "at the top", "at the bottom", "at the front", "at the back", "leading", "trailing", etc. is used with respect to the orientation of the figures currently being described. Since component parts of exemplary embodiments of the present invention can be positioned in a number of different orientations, the direction terminology is used for illustration purposes and not restrictively in any way whatsoever. It goes without saying that other exemplary embodiments can be used and structural or logical changes can be made, without departing from the scope of the present invention. Therefore, the following detailed description should not be interpreted in a restrictive sense, and the scope of the present invention is defined by the appended patent claims.

The terms "substrate" or "semiconductor substrate" which are used in the following description encompass any semiconductor-based structure having a semiconductor surface. Substrate and structure should be understood such that they comprise silicon, silicon on insulator (SOI), silicon on sapphire (SOS), doped and undoped semiconductors, epitaxial layers of silicon supported by a basic or base semiconductor layer, and other semiconductor structures. By way of example, the "substrate" or "semiconductor substrate" can be a monocrystalline material. The semiconductor need not be based on silicon. The semiconductor can likewise be silicon carbide, silicon-germanium, germanium, germanium arsenide or gallium arsenide or gallium nitride.

In the present disclosure, reference is made to doped parts, such as, for example, doped parts of a first or of a second conductivity type. As should clearly be understood, the terms "first" and "second" conductivity types can relate to n- or p-doped semiconductor parts, or vice versa. These parts can be formed by generally known doping methods by means of dopants, such as, for example, As, P, S, Sb as an n-type dopant for silicon material. Examples of a p-type dopant for silicon material include B, Al or In.

The expressions "coupled" and/or "electrically coupled" used herein do not require direct coupling, but rather permit elements between the "coupled" or "electrically coupled" elements. The expression "electrically connected" is intended to indicate a low-resistance electrical connection between the elements that are electrically connected to one another.

Figure 1A:
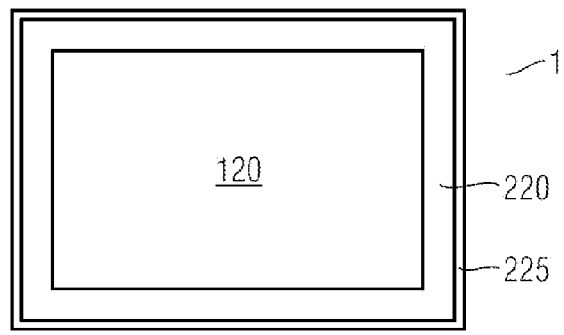
FIG. 1A shows a plan view of a semiconductor component.

FIG. 1A shows a plan view of a semiconductor component 1 in accordance with one embodiment. The semiconductor component 1 comprises an active region 120 and an edge region 220 arranged at the edge. By way of example, the semiconductor component 1 can be realized in a semiconductor chip, and the active region 120 is arranged in the central region of the semiconductor chip, while the region 220 is arranged at the edge of the semiconductor chip. Situated at the outermost edge of the semiconductor chip there is a sawing or scribing frame 225, at which the individual semiconductor chips are sawn from a semiconductor wafer during singulation, for example.

In FIG. 1A the semiconductor component 1 is illustrated as rectilinear, for example square. However, it goes without saying that the component 1 can assume any arbitrary shape. By way of example, the corners can be rounded, or the semiconductor component 1 can be realized as substantially round, oval, or with any other shape. The active region 120 contains those component parts such as gate, source, drain, anode, cathode, for example, which determine the functionality of the semiconductor component. By way of example, the active region 120 can be an arrangement having a multiplicity of component cells formed in a semiconductor substrate which are arranged parallel to one another and interconnected in parallel with one another. In accordance with a further embodiment, the active region 120 can also contain just one component cell. Examples of the component cells include unipolar components such as, for example, MOSFETs (Metal Oxide Semiconductor Field Effect Transistor) or Schottky diodes. Further examples may be bipolar components such as, for example, diodes, in particular PIN diodes, bipolar transistors, IGBTs (Insulated Gate Bipolar Transistor) or thyristors. Furthermore, different components can be combined with one another in the active region 120.

The edge region 220 arranged outside the active region contains elements of the edge termination. Said elements generally serve to laterally reduce vertical voltages within the semiconductor component, which can be for example a plurality of 100 V or a plurality of 1000 V. The blocking capability of the semiconductor component is ensured given a suitably configured edge region. Examples of edge termination structures in the edge region comprise one or a combination of guard rings, field plates, junction termination extension (JTE) structures, variation of lateral doping (VLD) structures.

Figure 1B:
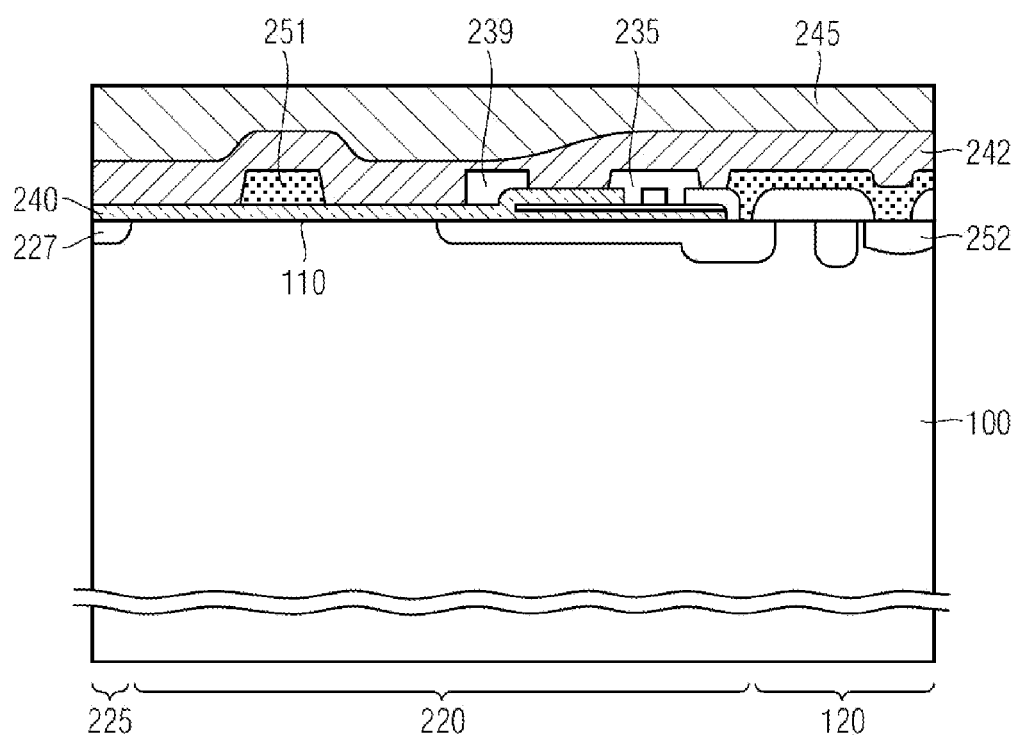
FIG. 1B shows a cross-sectional view of a part of the semiconductor component shown in FIG. 1A.

FIG. 1B then shows a cross-sectional view of a part of an edge termination of the semiconductor component illustrated in FIG. 1A. Different doped regions 227, 252 are formed in a first main surface 110 of a semiconductor component 100. In this case, the region illustrated on the left in FIG. 1B is the scribing frame 225 containing the doped region 227, which can be p- or n-doped. The doped region 252 is part of the active region of the semiconductor component. The insulation layer 240 and, if appropriate, further layers are arranged above the first main surface 110 of the semiconductor component. The edge region 220 is arranged between active region 120 and scribing frame 225. Firstly, a so-called channel stopper electrode 251, which can be connected to the drain potential, for example, is provided in the edge region 220. The edge region 220 can furthermore comprise a source field plate 239, which can be at source potential. Usually, the reverse voltage is reduced laterally between the source field plate 239 and the channel stopper electrode 251. The channel stopper electrode 251 is interconnected for example such that it influences the profile at the equipotential lines in such a way that the reverse voltage can be reduced in a suitable manner. Furthermore, the so-called gate runner 235 can be arranged in the edge region 220. The gate runner has the task, for example, of distributing the gate potential in the active region among the respective gate electrodes. One of the abovementioned components is illustrated as an example in the active region 120. It goes without saying that said components can be embodied in any desired manner as described above. Furthermore, further layers, for example doped layers, metal layers, etc., can be provided on the underside of the semiconductor substrate 100 in order to ensure the functionality of the component.

Figure 2A:
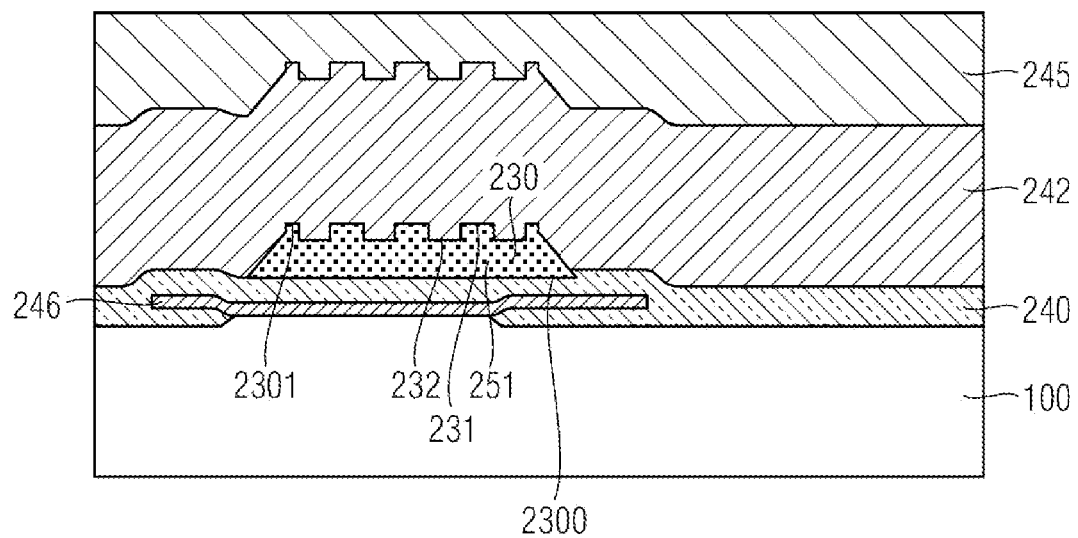
FIGS. 2A and 2B schematically illustrate a part of the semiconductor component shown in FIG. 1B in accordance with embodiments.

FIG. 2A shows a cross-sectional view of a part of an edge termination 220, in particular of the channel stopper electrode 251. The cross-sectional view illustrated shows an insulating layer 240 arranged above the first main surface 110 of a semiconductor substrate 100, which insulating layer can be produced from silicon oxide, for example. Furthermore, a conductive layer 246, for example a polysilicon layer, can be arranged between the channel stopper electrode 251 and the semiconductor surface 110. A part of the insulating layer 240 is furthermore arranged between the conductive layer 246 and the channel stopper electrode 251. A further insulating layer 242, which can contain imide or some other suitable insulator, for example, is arranged above said layers. Furthermore, a suitable terminating material 245 such as soft potting or molding compound, for example, can be arranged above the imide layer 242.

It has been established that it is possible to improve the reliability of the semiconductor component over a longer period if a conductive element 230 of the semiconductor component, for example one of the electrodes, for example the channel stopper electrode 251, on the side facing away from the semiconductor substrate 100, has an enlarged surface compared with a horizontal layer.

Figure 2B:
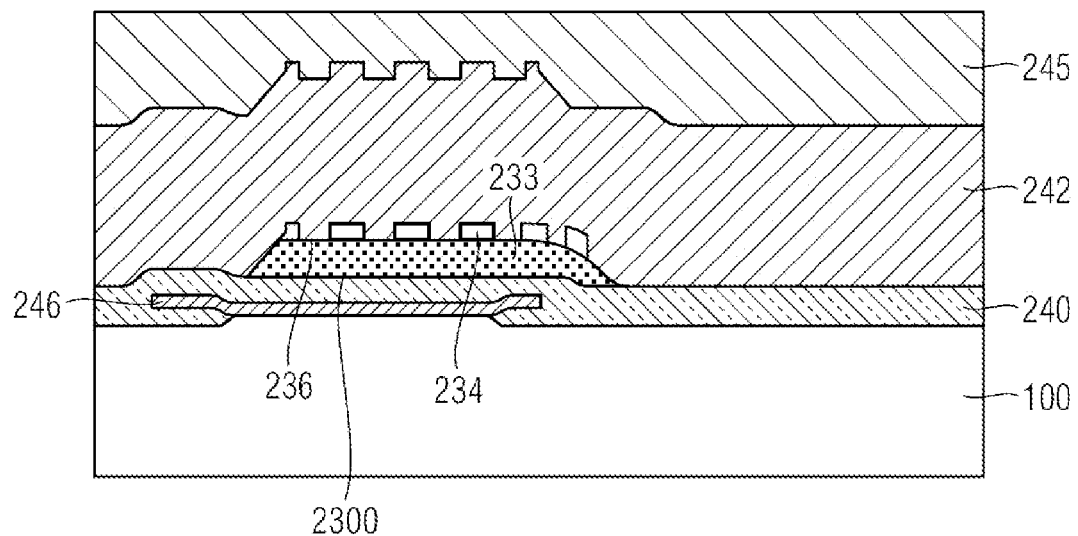

By way of example, as shown in FIG. 2A, the element can have an element region not adjoined by any electrical contacts to an overlying or underlying electrically conductive plane. With regard to the structure shown in FIG. 2A, this means that the element can indeed be electrically conductively connected to other components or electrically conductive planes. However, the contacts are situated in a plane in front of or behind the illustrated plane of the drawing. As shown in FIG. 2A, an enlarged surface compared with the surface facing the semiconductor substrate can be provided on the surface of the element facing away from the semiconductor substrate. For example, the surface 2301 of the element 230 facing away from the semiconductor substrate 100 can be patterned and have elevations 231 and depressions 232. In this case, the element 230 can be constructed from just one conductive layer. Alternatively, it is also conceivable for the element 230 to contain a base layer 233 having a planar surface and also a patterning layer 234, which can be constructed for example from individual webs and interspaces 236 arranged therebetween, as is illustrated in FIG. 2B. The patterning layer 234 can be produced from a material that is selectively etchable with respect to the material from the base layer 233. Furthermore, the patterning layer 234 can be produced from conductive material, for example. If the element 230 contains a base layer 233 and a patterning layer 234, the depth of the elevations can be set by the layer of the patterning layer 234. Accordingly, the enlargement of the surface of the element 230 compared with a horizontal surface can also be set. The width of the element 230 is for example approximately 10 to 300 µm, furthermore by way of example between 20 and 100 µm, and the projecting regions 231 can have for example a width of 100 nm to 50 µm and in each case a suitably chosen depth, wherein the width of the element and the width of the projecting regions are measured in each case along the same direction. By way of example, the depth can be chosen such that the surface is enlarged to a desired extent. The depth can be for example more than 5 nm up to a plurality of µm, furthermore by way of example more than 100 nm to 1 µm. FIG. 2B shows, moreover, a slightly altered geometry of the channel stopper electrode 251, which extends laterally across the sidewall of the elevated region of the insulating layer 240 and in the case of which the conductive layer 246 has a somewhat smaller lateral extent. It goes without saying that this geometry of the channel stopper electrode 251 can be applied to any other embodiments of the semiconductor component. Conversely, the embodiment shown in FIG. 2B can also be embodied with a different geometry of the channel stopper electrode.

Figure 3A:
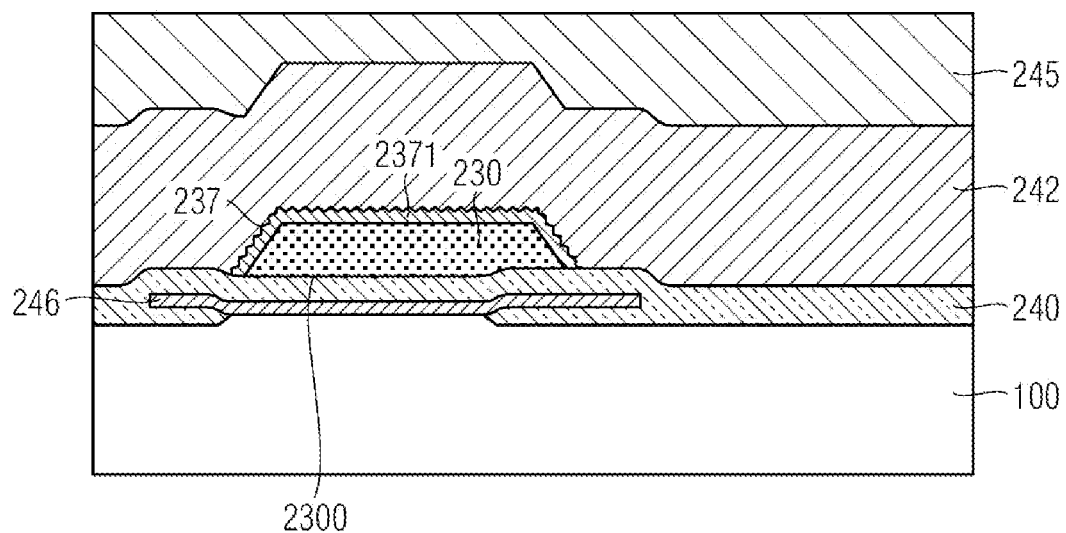
FIGS. 3A and 3B show cross-sectional views of a part of a semiconductor component in accordance with a further embodiment.
Figure 3B:
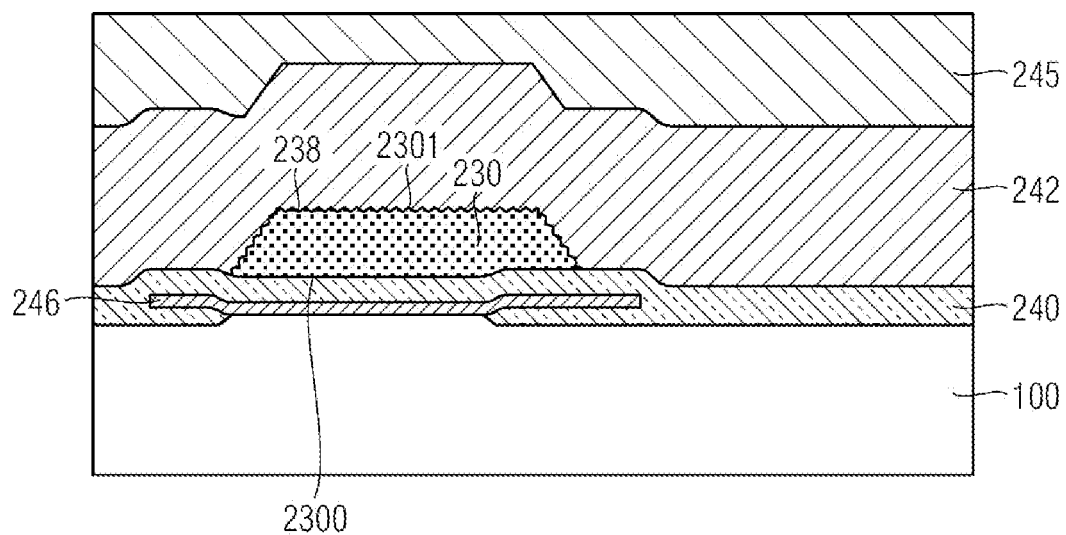

FIGS. 3A and 3B illustrate an alternative configuration of the element 230 having an enlarged surface of the element 230. In FIG. 3A, the same reference signs designate the same elements as in FIG. 2A, and so a detailed description of the elements is omitted. In accordance with FIG. 3A, a further layer 237 is provided above the element 230, the surface 2371 of said further layer being porous. In accordance with one configuration, the layer 237 can be embodied as a continuous and homogeneous layer above the element 230 and can subsequently be made porous by means of a suitable etching method. Alternatively, however, it is also possible for the porous structure already to be produced by means of the deposition method. Examples of the material of the porous layer include any conductive materials which can be applied as a porous layer, such as copper, aluminum or doped polysilicon, for example.

In accordance with the embodiment shown in FIG. 3B, the surface 2301 of the element 230 itself is made porous, such that a multiplicity of small pores 238 are provided in the surface 2301 of the element 230. By way of example, the diameter of the pores 238 can be 10-100 nm. The surface 2301 of the element 230 can be made porous for example by means of suitable etching methods, for example anodic etching or anodic oxidation, and, if appropriate, subsequent removal of the oxide layer produced.

The semiconductor component shown in FIGS. 2A, 2B, 3A and 3B thus comprises an element 230 composed of a conductive material, which is arranged above a surface 110 of a semiconductor substrate 100, having an element region not adjoined by any electrical contacts to an overlying or underlying electrically conductive plane. A surface of the element region facing away from the semiconductor substrate 100 is patterned with elevations or depressions, and a surface of the element region facing the semiconductor substrate 100 is patterned to a lesser extent or is not patterned. The element region can in each case be as small as desired, as long as the surface facing away from the semiconductor substrate is patterned with elevations or depressions. In this case, the term "overlying or underlying electrically conductive plane" encompasses for example a metallization layer arranged in a different component plane of the semiconductor component, a doped semiconductor layer buried in the semiconductor substrate or arranged thereon, the semiconductor substrate itself, or regions of the semiconductor substrate.

By way of example, the surface of the element region 2301 facing away from the semiconductor substrate can be patterned photolithographically. In accordance with one embodiment, the element can comprise a first layer and a second layer 234 arranged above the first layer 233, and the second layer 234 can be patterned.

In accordance with a further embodiment, the surface of the element region 2301 facing away from the semiconductor substrate can be porous, wherein the elevations or depressions are realized by parts of pores. Alternatively, the surface of the element region facing away from the semiconductor substrate can have dendrites, and the elevations or depressions are realized by parts of the dendrites. In accordance with a further embodiment, the depressions 232 can extend as far as a surface 2300 of the element region facing the semiconductor substrate and can thus form openings.

By way of example, a surface of the element region 2300 facing the semiconductor substrate can be horizontal. Furthermore, a surface roughness on the surface 2301, 2371 of the element region facing away from the semiconductor substrate can be greater than on the surface 2300 of the element region facing the semiconductor substrate. By way of example, the surface roughness can be ascertained by measuring the distance from a predefined number of, for example uniformly or randomly distributed, locations on the surface 2300, 2301, 2371 with respect to a reference plane, determining the mean value and the standard deviation or variance. By way of example, the surface 2301, 2371 facing away from the semiconductor substrate can have a surface roughness increased by more than 10%, in accordance with a further embodiment more than 50% and in particular more than 100% compared with the surface 2300 facing the semiconductor substrate.

By way of example, a surface 2300 of the element region facing the semiconductor substrate can be horizontal, and a surface 2301, 2371 facing away from the semiconductor substrate can have an enlarged surface compared with a horizontal surface. An enlargement of the surface can thus be obtained without enlarging the chip area occupied by the metallization. The semiconductor component furthermore comprises an insulating layer 242 above the element 230.

In this case, the surface 2301 facing away from the semiconductor substrate can have elevations 234 and depressions 236. Alternatively, the surface 2301, 2371 facing away from the semiconductor substrate 100 can be porous.

Figure 4A:
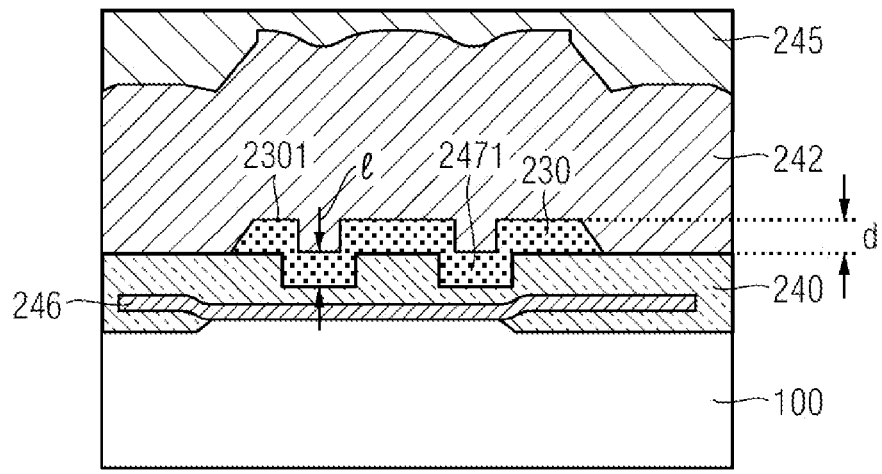
FIGS. 4A and 4B show cross-sectional views of a part of a further embodiment of a semiconductor component.
Figure 4B:
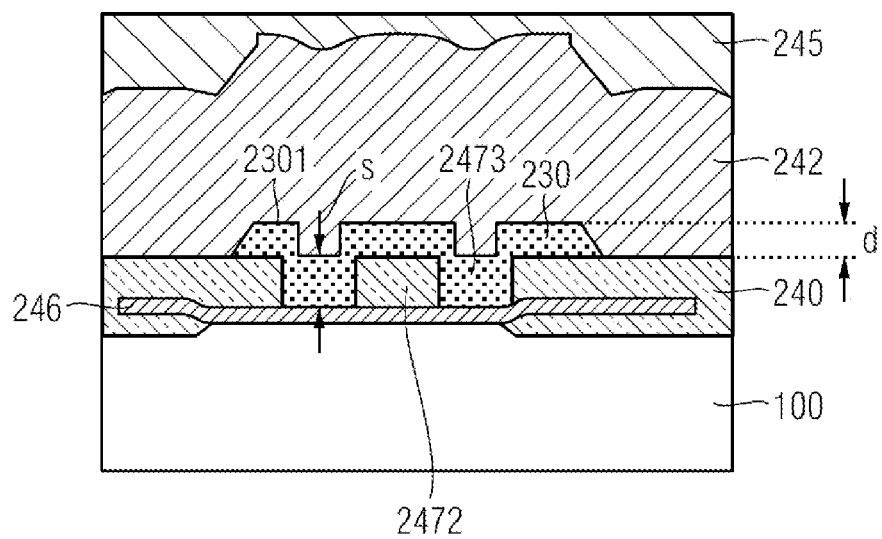

FIGS. 4A, 4B show further embodiments. In accordance with FIGS. 4A and 4B, an enlargement of the surface of the element 230 is achieved by virtue of the fact that a layer arranged below the element is suitably patterned. To put it more precisely, the surface of the layer 247 facing the element 230 is patterned such that, depending on the layer thickness d of the element, the surface of the element facing away from the semiconductor substrate has an enlargement of, for example, at least 10%, 30% or more than 100% relative to a horizontal surface. By way of example, as shown in FIG. 4A, the layer 246 can be patterned in such a way that it has depressions. In this case, the depth l of the depressions 2471 can be determined for example by the etching time during the etching of the layer 247. The depth l of the depressions is determined such that a predefined enlargement compared with a horizontal surface is obtained for a predefined layer thickness of the conductor layer 230. In this case, the predefined enlargement can comprise for example at least 10%, but of course also an arbitrarily greater value, for example more than 20% or 30% or 100%. In accordance with a further embodiment, the layer 247 can be patterned in such a way that it has webs and interspaces between the webs. Openings are therefore formed in the layer 247. This situation is illustrated in FIG. 4B. By choosing the layer thickness s of the patterning layer 247, it is thus possible to determine the depth and thus for example the height of the webs 2472. Accordingly, here, too, the surface 2301 of the element facing away from the semiconductor substrate can have a predefined enlargement compared with a horizontal surface. By way of example, the enlargement can be dependent on the layer thickness d of the element 230. In accordance with a further embodiment, here the sum of the horizontally measured areas of the openings can be at least for example 5%, 30% or 50% of the horizontally measured area of the element. That is to say that the area of the element that is occupied by openings, for example contacts, is at least for example 5%, 30% or 50% of the element area. By way of example, the openings can be embodied continuously as a through opening or else as interrupted openings.

In the case of the embodiments illustrated in FIGS. 4A and 4B, an enlargement of the surface of the element 230 is possible without excessively high additional processing outlay and without an enlargement of the basic area of the metallization.

Figure 5A:
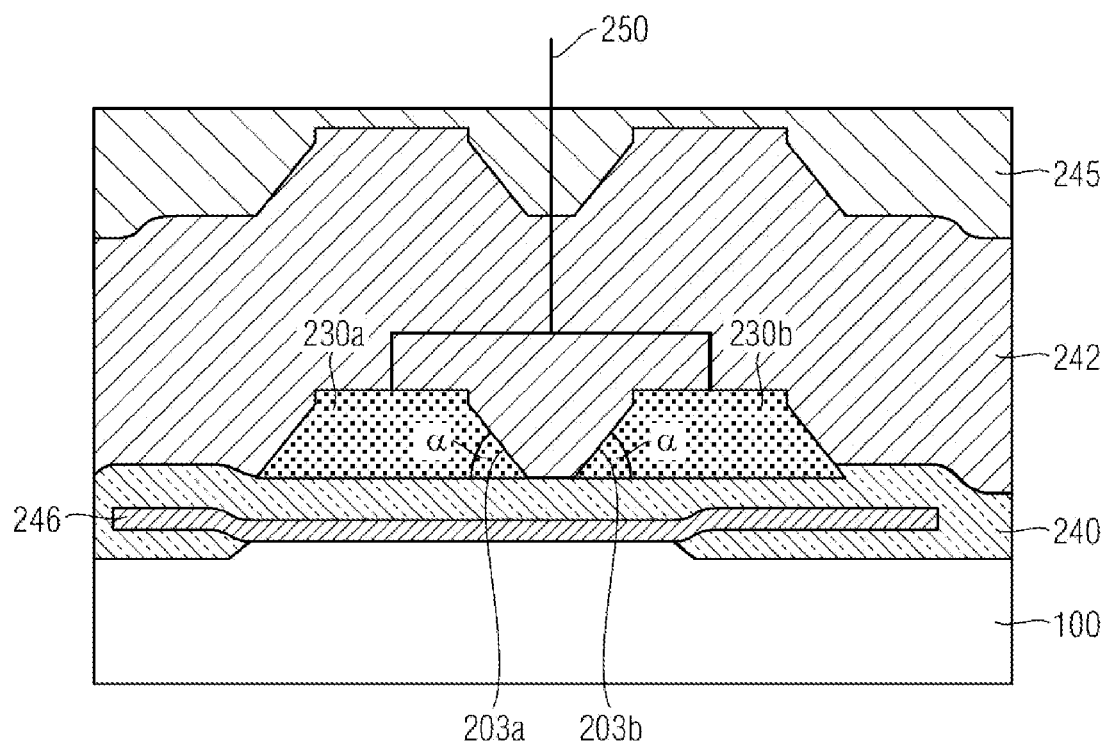
FIG. 5A shows a cross-sectional view of a part of a further embodiment of a semiconductor component.
Figure 5B:
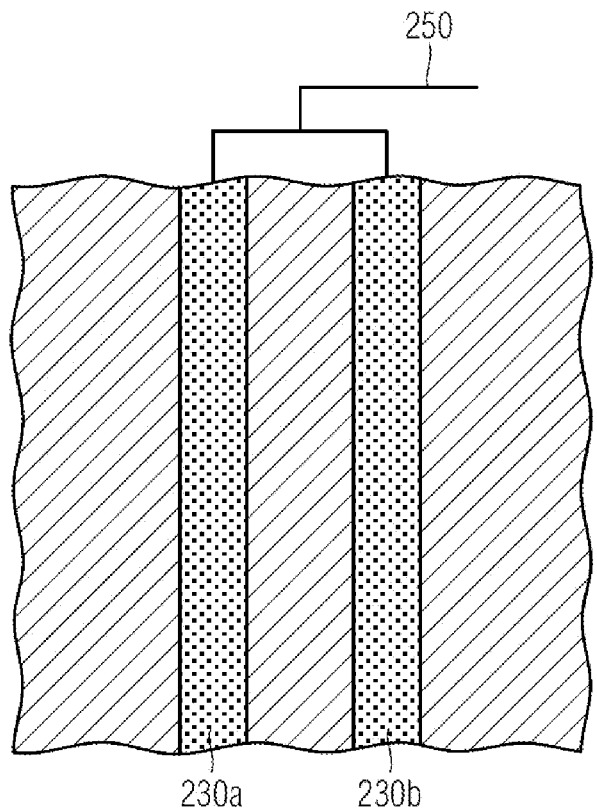
FIGS. 5B to 5D show plan views of the semiconductor component shown in FIG. 5A.

In accordance with the embodiment illustrated in FIG. 5A, in the edge region outside the transistor arrangement the semiconductor component comprises a field plate, wherein openings are formed in the field plate and the field plate is arranged above a surface of the semiconductor substrate or at least two field plate sections arranged above a surface of the semiconductor substrate, which are connected to a common terminal. As is illustrated in FIG. 5B, the field plate can comprise for example a plurality of, for example two or three, field plate sections 230a, 230b spaced apart from one another. The field plate sections 230a, 230b can be spatially separated from one another completely, for example along their entire length. The field plate sections 230a, 230b can be connected to a common electrical terminal, such that they are kept at one potential. By way of example, the field plate sections 230a, 230b can be connected to the drain or source potential. The field plate sections spatially separated from one another can for example run parallel or run adjacent to one another in some other way.

Figure 5C:
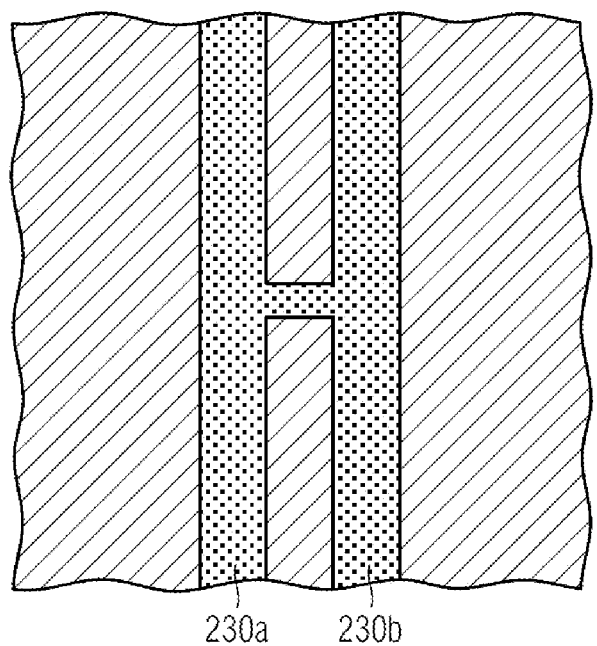
Figure 5D:
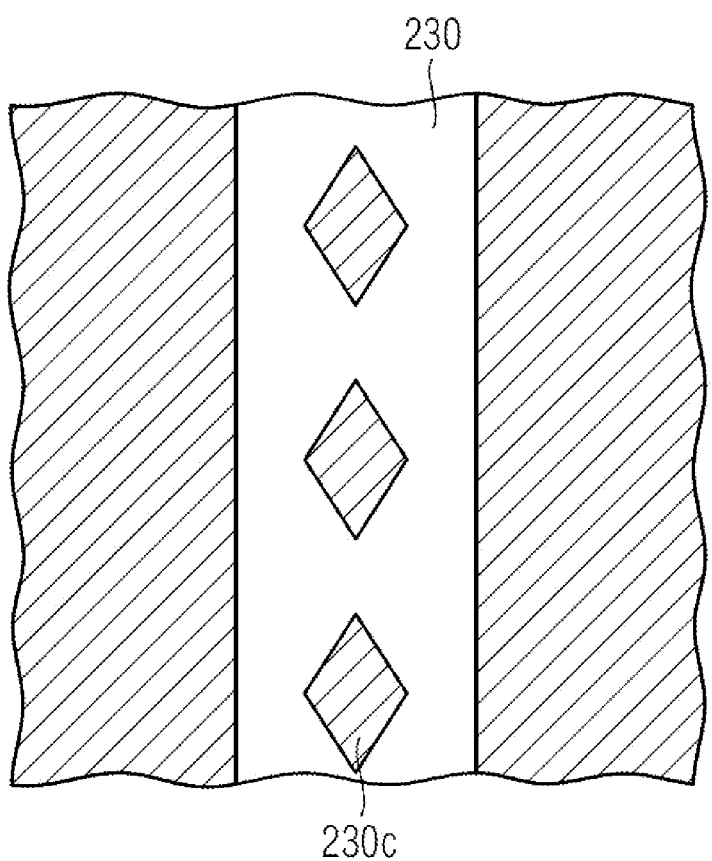

As is illustrated in FIG. 5C, the field plate sections 230a, 230b can also be spatially separated from one another in sections and spatially connected to one another in places. Furthermore, as illustrated in FIG. 5D, the field plate 230 can have openings 230c which can have an arbitrary shape.

FIG. 5A shows a cross-sectional view of these embodiments. The sidewalls 203a, 203b of the field plate sections 230a, 230b can be formed for example non-perpendicularly with respect to a horizontal surface, for example the surface region of the adjoining insulation layer 240. In accordance with one embodiment, the angle α measured between the sidewall 203a, 203b and the surface region adjoining the respective field plate section 230a, 230b is less than 90°, for example 40 to 80°. By setting the parameters of the method for etching the openings 230c or at least partly separating the field plate sections 230a, 230b, it is possible to set the angle α to a desired value.

In accordance with the embodiment shown in FIGS. 5A to 5D, the resulting surface of the two field plate sections 230a, 230b is enlarged compared with a single element or an element without openings, such that the reliability of the semiconductor component is increased. In this case, an enlargement of the surface of the element 230 is possible without excessively high additional processing outlay and without an enlargement of the basic area of the metallization. The field plate sections 230a, 230b or the openings in the field plate 230 can be produced by means of an etching method using a suitable etching mask. By way of example, the interspaces between adjacent field plate sections 230a, 230b and the openings 230c in the field plate 230 can be etched by means of wet-chemical or plasma etching methods.

The element 230 described in this description can form the channel stopper electrode 251. Alternatively, however, it can also form any other field electrode, for example the source field plate 239. In accordance with a further configuration, the element described in the context of this application can also be arranged within the active region of the semiconductor component. The element 230 can be produced from an arbitrary conductive material, for example from aluminum or from other metals or metal combinations, for example TiW/Cu/TiN. Furthermore, the element 230 can also contain polysilicon.

Figure 6:
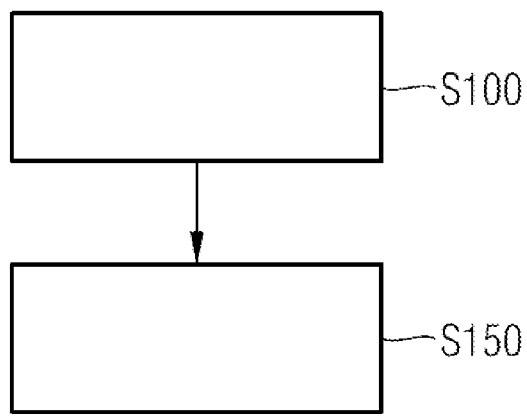
FIG. 6 illustrates a method for producing a semiconductor component.

FIG. 6 illustrates a method for producing a semiconductor component. The method comprises forming an element composed of a conductive material above a surface of a semiconductor substrate, wherein a surface of the element region facing away from the semiconductor substrate is patterned with elevations or depressions (S100) and a surface of the element region facing the semiconductor substrate is patterned to a lesser extent or is not patterned, and forming an insulating layer above the element (S150). In accordance with one embodiment, forming the element can comprise forming an element having a planar surface and a subsequent method for producing a porous surface. By way of example, the element can be made porous by means of a suitable etching method. Examples of suitable methods for producing a porous surface include anodic etching or anodic oxidation, for example.

In accordance with a further alternative, the element can be formed by forming an element having a planar surface and applying a porous layer. Examples of applying a porous layer include a so-called plasma dust method, for example. The grain size can be controlled in a targeted manner here by means of the deposition parameters and a suitable heat treatment optionally carried out afterward. Examples of a metallization that can be produced by means of this method include copper and aluminum.

In accordance with a further configuration, metallic dendrites can be grown, which can be implemented for example in the case of a copper or silver metallization.

In accordance with a further embodiment, the surface of the element region facing away from the semiconductor substrate can be patterned photolithographically.

In accordance with one embodiment, the element can be embodied in an integral fashion or comprise a plurality of layers. By way of example, the element can be formed with a planar surface. Afterward, a patterning layer can be applied and patterned. By way of example, the patterning layer can be selectively etchable with respect to the material of the element, such that the height of the elevations and thus the surface enlargement can be set by determining the layer thickness of the patterning layer.

Figure 7:
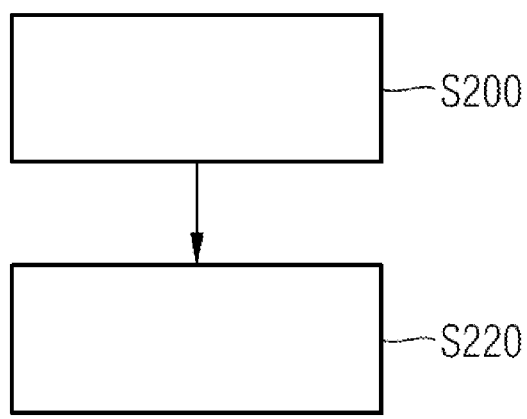
FIG. 7 illustrates a method for producing a semiconductor component in accordance with a further embodiment.

FIG. 7 illustrates a method for producing a semiconductor component in accordance with a further embodiment. The method shown in FIG. 7 comprises forming a patterning layer above a surface of a semiconductor substrate (S200), forming an element composed of a conductive material above the patterning layer (S220), wherein a surface of the patterning layer facing the element is patterned such that, depending on the layer thickness of the element, the surface of the element facing away from the semiconductor substrate has an enlargement of 10% or more compared with a horizontal surface.

In accordance with this embodiment, the element can be formed by forming and patterning a patterning layer arranged below the element. In this case, for example, the patterning can be carried out in such a way that a predetermined surface enlargement can be obtained for a predefined layer thickness of the element. In accordance with one configuration, for example, the layer thickness of the patterning layer can be dimensioned suitably. The patterning layer can be patterned by locally complete removal (relative to the layer thickness of the patterning layer) of the patterning layer. A predetermined surface enlargement can be obtained as a result. Alternatively, it is possible to define depressions into the patterning layer by means of etching, for example. By dimensioning the depth of the depressions, it is likewise possible to obtain a predetermined surface enlargement.

In accordance with further embodiments, the various measures for enlarging the surface can also be combined with one another.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor component, comprising:
    an electrode composed of a conductive material, which is arranged above a surface of a semiconductor substrate, having a first region electrically conductively connected to an overlying or underlying electrically conductive plane, and a second region not adjoined by direct electrical contact to the overlying or underlying electrically conductive plane;
    an active region having a component cell formed in the semiconductor substrate; and
    an edge region outside the active region,
    wherein the electrode is arranged in the edge region,
    wherein a surface of the second region facing away from the semiconductor substrate is patterned with elevations or depressions and a surface of the second region facing the semiconductor substrate is patterned to a lesser extent or is not patterned.

2. The semiconductor component of claim 1, wherein the surface of the second region facing away from the semiconductor substrate is patterned photolithographically.

3. The semiconductor component of claim 1, wherein the electrode comprises a first layer and a second layer arranged above the first layer, and the second layer is patterned photolithographically.

4. The semiconductor component of claim 1, wherein the surface of the second region facing away from the semiconductor substrate is porous and the elevations or depressions are realized by parts of pores.

5. The semiconductor component of claim 1, wherein the surface of the second region facing away from the semiconductor substrate has dendrites and the elevations or depressions are realized by parts of the dendrites.

6. The semiconductor component of claim 1, wherein the depressions extend as far as the surface of the second region facing the semiconductor substrate.

7. The semiconductor component of claim 1, wherein the surface of the second region facing the semiconductor substrate is horizontal.

8. The semiconductor component of claim 1, wherein a surface roughness of the surface of the second region facing away from the semiconductor substrate is greater than a surface roughness of the surface of the second region facing the semiconductor substrate.

9. The semiconductor component of claim 1, wherein the active region comprises a multiplicity of component cells formed in the semiconductor substrate and arranged parallel to one another.

10. A semiconductor component, comprising:
    an element composed of a conductive material, which is arranged above a surface of a semiconductor substrate; and
    a single layer arranged below the element within at least part of the projected area of the element and having a surface facing the element which is patterned such that a surface of the element facing away from the semiconductor substrate has an enlargement of 10% or more compared with a surface of the element facing the semiconductor substrate,
    wherein the element is a field plate.

11. The semiconductor component of claim 10, further comprising:
    an active region having a component cell formed in the semiconductor substrate; and
    an edge region outside the active region,
    wherein the element is arranged in the edge region.

12. The semiconductor component of claim 11, wherein the active region comprises a multiplicity of component cells formed in the semiconductor substrate and arranged parallel to one another.

13. The semiconductor component of claim 11, wherein the surface of the layer facing the element is patterned to form openings extending as far as the surface of the layer facing the element.

14. The semiconductor component of claim 13, wherein the sum of the horizontally measured areas of the openings amounts to at least 5% of the horizontally measured area of the element.

15. The semiconductor component of claim 10, wherein the field plate is electrically connected to a source terminal.

16. A semiconductor component, comprising:
an element composed of a conductive material, which is arranged above a surface of a semiconductor substrate; and
a single layer arranged below the element within at least part of the projected area of the element and having a surface facing the element which is patterned such that a surface of the element facing away from the semiconductor substrate has an enlargement of 10% or more compared with a surface of the element facing the semiconductor substrate,
wherein the element is a channel stopper field electrode.

* * * * *

UNITED STATES PATENT AND TRADEMARK OFFICE
CERTIFICATE OF CORRECTION

PATENT NO. : 9,825,136 B2
APPLICATION NO. : 14/643289
DATED : November 21, 2017
INVENTOR(S) : F. Niedernostheide et al.

Page 1 of 1

It is certified that error appears in the above-identified patent and that said Letters Patent is hereby corrected as shown below:

On the Title Page

References, Other Publications, please change "retrived" to --retrieved--.

Signed and Sealed this
Tenth Day of July, 2018

Andrei Iancu
*Director of the United States Patent and Trademark Office*